US009240454B1

United States Patent
Liu et al.

(10) Patent No.: US 9,240,454 B1
(45) Date of Patent: Jan. 19, 2016

(54) INTEGRATED CIRCUIT INCLUDING A LINER SILICIDE WITH LOW CONTACT RESISTANCE

(71) Applicant: STMicroelectronics, Inc., Coppell, TX (US)

(72) Inventors: Qing Liu, Watervliet, NY (US); Walter Kleemeier, Albany, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/520,781

(22) Filed: Oct. 22, 2014

(51) Int. Cl.
| | |
|---|---|
| H01L 27/12 | (2006.01) |
| H01L 29/00 | (2006.01) |
| H01L 21/82 | (2006.01) |
| H01L 29/45 | (2006.01) |
| H01L 27/092 | (2006.01) |
| H01L 21/8238 | (2006.01) |
| H01L 29/78 | (2006.01) |
| H01L 29/778 | (2006.01) |

(52) U.S. Cl.
CPC ........ *H01L 29/45* (2013.01); *H01L 21/823814* (2013.01); *H01L 21/823871* (2013.01); *H01L 27/092* (2013.01); *H01L 27/1203* (2013.01); *H01L 29/7841* (2013.01); *H01L 21/8238* (2013.01); *H01L 29/778* (2013.01); *H01L 29/7789* (2013.01)

(58) Field of Classification Search
CPC . H01L 21/8238; H01L 27/092; H01L 29/778; H01L 29/7789
See application file for complete search history.

(56) References Cited

U.S. PATENT DOCUMENTS

| | | | | |
|---|---|---|---|---|
| 5,872,039 | A * | 2/1999 | Imai | 438/291 |
| 5,990,530 | A * | 11/1999 | Suzuki | 257/408 |
| 6,943,407 | B2 * | 9/2005 | Ouyang et al. | 257/329 |
| 7,473,947 | B2 | 1/2009 | Murthy et al. | |
| 7,947,971 | B2 * | 5/2011 | Majhi et al. | 257/12 |
| 8,709,896 | B2 * | 4/2014 | Haneda et al. | 438/280 |
| 8,828,851 | B2 | 9/2014 | Loubet et al. | |
| 2005/0054169 | A1 | 3/2005 | Wagner et al. | |
| 2006/0273347 | A1 * | 12/2006 | Hikita et al. | 257/192 |
| 2007/0292999 | A1 * | 12/2007 | Henning et al. | 438/167 |
| 2008/0135878 | A1 * | 6/2008 | Kim et al. | 257/192 |
| 2009/0289279 | A1 * | 11/2009 | Khare | 257/190 |
| 2011/0183480 | A1 * | 7/2011 | Chang | H01L 21/8258 438/168 |
| 2012/0153303 | A1 * | 6/2012 | Uchida | 257/77 |
| 2012/0313151 | A1 * | 12/2012 | Lee | 257/288 |
| 2013/0020650 | A1 * | 1/2013 | Ema et al. | 257/368 |
| 2014/0191298 | A1 * | 7/2014 | Chen et al. | 257/288 |

OTHER PUBLICATIONS

Schubert, E.F.: "Delta Doping of III-V Compound Semiconductors: Fundamentals and Device Applications," J. Vac. Sci. Technol. A 8 (3), May/Jun. 1990, pp. 2980-2996.

* cited by examiner

*Primary Examiner* — Ida M Soward
(74) *Attorney, Agent, or Firm* — Gardere Wynne Sewell LLP

(57) ABSTRACT

An integrated circuit includes a substrate supporting a transistor having a source region and a drain region. A high dopant concentration delta-doped layer is present on the source region and drain region of the transistor. A set of contacts extend through a pre-metal dielectric layer covering the transistor. A silicide region is provided at a bottom of the set of contacts. The silicide region is formed by a salicidation reaction between a metal present at the bottom of the contact and the high dopant concentration delta-doped layer on the source region and drain region of the transistor.

24 Claims, 9 Drawing Sheets

US 9,240,454 B1

INTEGRATED CIRCUIT INCLUDING A LINER SILICIDE WITH LOW CONTACT RESISTANCE

TECHNICAL FIELD

The present invention relates to the fabrication of integrated circuits and, more particularly, to a process technique for forming silicide contacts to source-drain regions having low contact resistance.

BACKGROUND

Those skilled in the art recognize the importance of forming a low resistance contact to source-drain regions of transistor devices. Low resistance connections are typically supported by silicides. However, as transistor sizes continue to scale downward, contact areas decrease and contact resistance concerns rise. There is accordingly a need in the art for a process technique that will support the formation of lower contact resistances as process geometries shrink.

SUMMARY

In an embodiment, an integrated circuit comprises: an nMOS transistor having a source region, a drain region and a gate; a pMOS transistor having a source region, a drain region and a gate; a high dopant concentration delta-doped layer on the source region and drain region of the pMOS transistor; a pre-metal dielectric layer covering the nMOS transistor and the pMOS transistor; a first set of contacts extending through the pre-metal dielectric layer to the source region and drain region of the nMOS transistor; a second set of contacts extending through the pre-metal dielectric layer to the source region and drain region of the pMOS transistor; a first silicide region at a bottom of the first set of contacts formed by a salicidation reaction between a metal and a first semiconductor material forming the source region and drain region of the nMOS transistor; and a second silicide region at a bottom of the second set of contacts formed by a salicidation reaction between a metal and the high dopant concentration delta-doped layer on the source region and drain region of the pMOS transistor.

In an embodiment, a process comprises: forming a source region and a drain region for an nMOS transistor from a first semiconductor material; forming a source region and a drain region for a pMOS transistor from a second semiconductor material; depositing a high dopant concentration delta-doped layer on the second semiconductor material; depositing an overlying a pre-metal dielectric layer; forming a first set of openings extending through the pre-metal dielectric layer to the source region and drain region of the nMOS transistor; forming a second set of openings extending through the pre-metal dielectric layer to the source region and drain region of the pMOS transistor; depositing a metal at the bottom of the first and second sets of openings; and heating to initiate a salicidation reaction. This salicidation reaction is provided between: the metal and the first semiconductor material to form a first silicide region on the source and drain regions of the nMOS transistor; and the metal and the high dopant concentration delta-doped layer to form a second silicide region on the source and drain regions of the pMOS transistor.

In an embodiment, an integrated circuit, comprises: a substrate; a transistor having a source region and a drain region supported by said substrate; a high dopant concentration delta-doped layer on the source region and drain region of the transistor; a pre-metal dielectric layer covering the transistor; a set of contacts extending through the pre-metal dielectric layer to the source region and drain region of the transistor; a silicide region at a bottom of the set of contacts formed by a salicidation reaction between a metal and the high dopant concentration delta-doped layer on the source region and drain region of the transistor.

BRIEF DESCRIPTION OF THE DRAWINGS

For a better understanding of the embodiments, reference will now be made by way of example only to the accompanying figures in which.

DETAILED DESCRIPTION OF THE DRAWINGS

Reference is now made to FIGS. 1-10 showing process steps for fabricating an integrated circuit.

Figure 1:
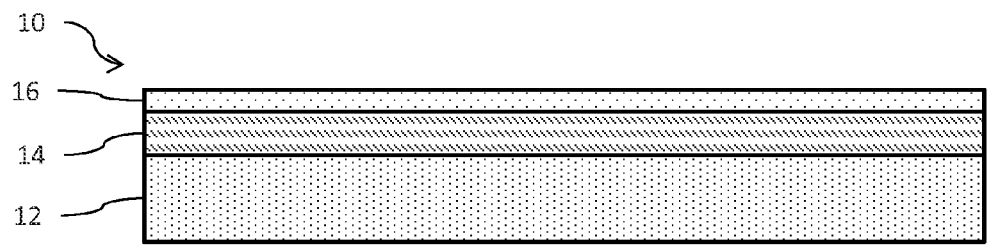
FIGS. 1-10 show process steps in accordance with an embodiment.

FIG. 1 shows an integrated circuit substrate 10. The substrate 10 comprises a silicon-on-insulator (SOI) substrate, as known in the art, including an underlying lightly doped substrate layer 12, an intermediate buried oxide layer 14 and an overlying semiconductor layer 16. More particularly, the overlying semiconductor layer may be fully depleted (i.e., intrinsic semiconductor), and thus the substrate 10 is of the fully depleted SOI substrate (FD-SOI) type. The semiconductor layer 16 may, for example, comprise silicon or silicon-germanium. The underlying lightly doped substrate layer 12 may be formed of silicon and have a thickness of 100-800 µm. The intermediate buried oxide layer 14 may have a thickness of 10-30 nm. The overlying semiconductor layer 16 may have a thickness of 4-10 nm.

Figure 2:
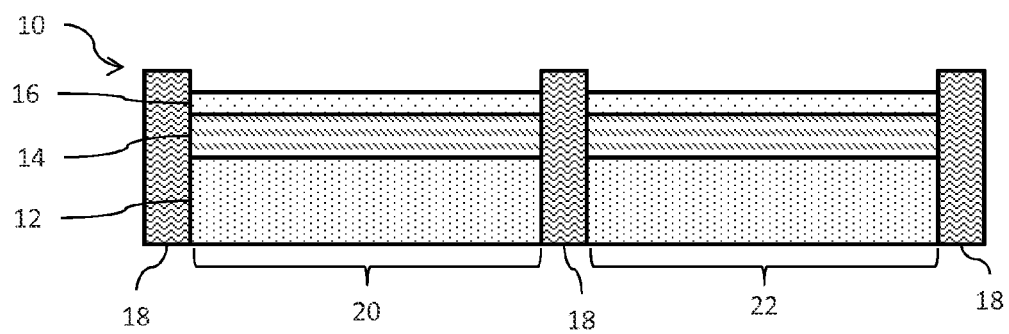

With reference now to FIG. 2, the substrate 10 has been divided by shallow trench isolation (STI) structures 18 (for example, formed by trenches filled with a silicon oxide (SiO or $SiO_2$) material) into a first active region 20 for supporting at least one nMOS transistor device and a second active region 22 for supporting at least one pMOS transistor device. Although the STI structures 18 are shown penetrating fully through the substrate 10, it will be understood that the structures 18 could alternatively partially penetrate the substrate 10 and terminate within the underlying lightly doped substrate layer 12.

In an embodiment, the overlying semiconductor layer 16 in the first active region 20 may comprise silicon (Si) semiconductor material while the overlying semiconductor layer 16 in the second active region 22 may comprise silicon-germanium (SiGe) semiconductor material. Techniques well known to those skilled in the art are available to produce silicon and silicon-germanium upper layer regions in an SOI substrate.

In an embodiment, the upper surface of the STI structures 18 is positioned above an upper surface of the overlying semiconductor layer 16. The offset between the two surfaces may, for example, have a thickness of 5-20 nm. In an alternative embodiment, the upper surfaces of the STI structures 18 and overlying semiconductor layer 16 are coplanar.

Figure 3:
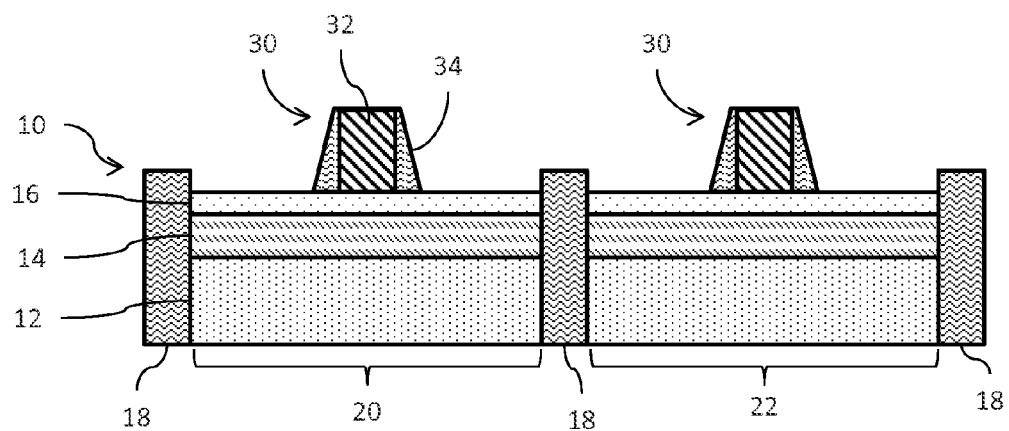

Reference is now made to FIG. 3. A dummy gate stack 30 is formed on top of the upper surface of the overlying semiconductor layer 16 in each region. The gate stack 30 includes a dummy gate structure 32 and sidewall spacers 34. The process for formation of the gate stack 30 is well known to those skilled in the art.

In an embodiment, the dummy gate structure 32 is formed of a polysilicon material. The polysilicon material may be doped as needed for the given application. A chemical vapor deposition (CVD) process may be used to deposit the polysilicon material in a layer. A suitable lithographic process as known in the art is then used to pattern the polysilicon material layer and form the dummy gate structures 32.

In an embodiment, the sidewall spacers 34 may be formed of one or more layers including, without limitation, oxide layers and nitride layers. The illustrated shape of the sidewall spacers 34 does not necessarily represent the actual shape of the spacers. The specific shape is not as important as making sure that the lateral surfaces of the gate structure 32 covered. An atomic layer deposition (ALD) process may be used to conformally deposit the material for the sidewall spacers 34, with an etch performed to remove the material from the horizontal surfaces so as to leave material on the sidewalls of the gate structure 32.

Although not explicitly shown, a cap layer may be provided over the gate structure 32 for each gate stack 30.

Figure 4:
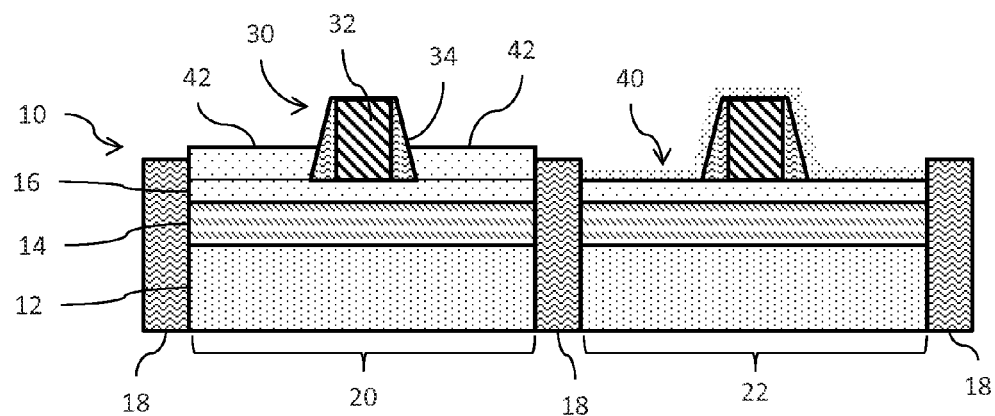

Reference is now made to FIG. 4. A masking material layer 40 is provided over the second region 22. This masking material layer 40 covers the gate stack 30 and overlying semiconductor layer 16 in the second region 22. The masking material layer 40 may comprise, for example, a silicon nitride (SiN) or a siliconborocarbonitride (SiBCN) material layer having a thickness of 2-5 nm. An atomic layer deposition process may be used to deposit the layer 40.

Using an epitaxial growth process as known in the art, semiconductor regions 42 are grown from the upper surface of the overlying semiconductor layer 16 in the first region 20 on either side of the gate stack 30. The regions 42 form raised source-drain (RSD) regions for the nMOS transistor device in the first region 20. The process for epitaxial growth of the regions 42 may comprise a hydrochloric (HCl) acid etch to ensure selectivity. The thickness of the regions 42 may, for example, comprise 10-30 nm. The material for the regions 42 may, for example, comprise silicon (Si) or silicon carbide (SiC). The regions 42 may be suitably doped in accordance with the application, for example, with phosphorus (P) or arsenic (As). The doping may be accomplished in situ with the epitaxial growth or through an implantation.

Figure 5:
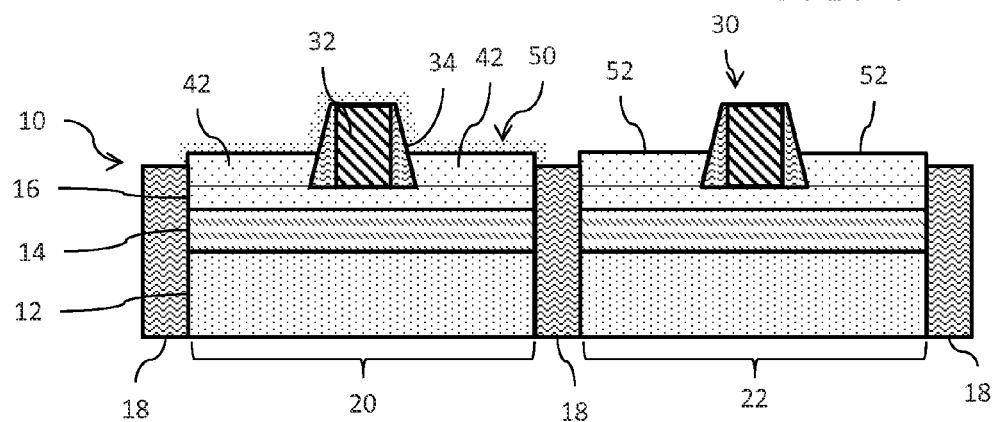

Reference is now made to FIG. 5. The masking material layer 40 is removed to expose the upper surface of the overlying semiconductor layer 16 in the second region 22 on either side of the gate stack 30. A dry or wet etch process as known in the art may, for example, be used to remove the layer 40.

Additionally, the regions 42 and the gate stack 30 in the first region 20 are covered by a masking layer 50. The masking material layer 50 may comprise, for example, a silicon nitride (SiN) material layer having a thickness of 2-5 nm. An atomic layer deposition process may be used to deposit the layer 50.

Using an epitaxial growth process as known in the art, semiconductor regions 52 are grown from the upper surface of the overlying semiconductor layer 16 in the second region 22 on either side of the gate stack 30. The regions 52 form raised source-drain (RSD) regions for the pMOS transistor device in the second region 22. The process for epitaxial growth of the regions 52 may comprise a hydrochloric (HCl) acid etch to ensure selectivity. The thickness of the regions 52 may, for example, comprise 10-30 nm. The material for the regions 52 may, for example, comprise silicon germanium (SiGe). The regions may be suitably doped in accordance with the application, for example, with boron (B). The doping may be accomplished in situ with the epitaxial growth or through an implantation. In an embodiment, in-situ boron doped epitaxially-grown RSD may have a boron concentration of $4 \times 10^{20}$ cm$^{-2}$ to $6 \times 10^{20}$ cm$^{-2}$.

Figure 6:
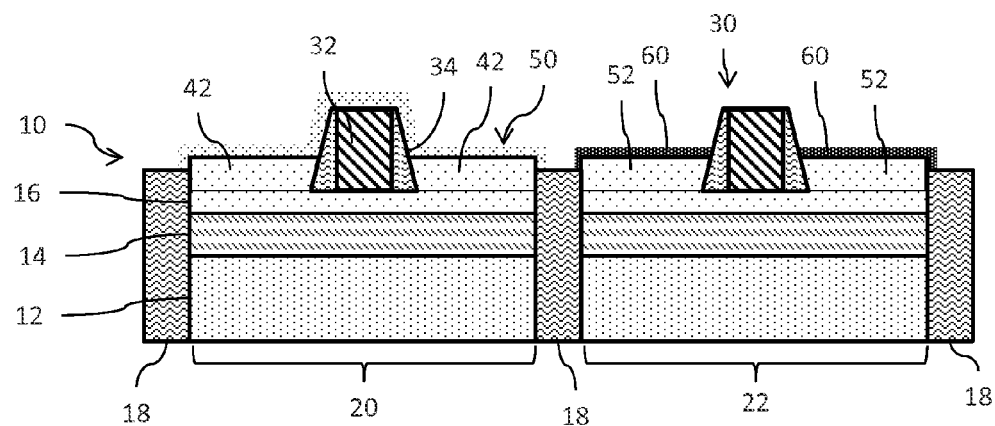

Using an atomic layer deposition (ALD) technique well known to those skilled in the art, a layer 60 of high boron (B) concentration delta-doped silicon germanium (SiGe) is deposited on the surfaces of the regions 52. The result of this process is shown in FIG. 6. In an embodiment, the layer 60 may have a boron concentration of $2 \times 10^{22}$ cm$^{-2}$. Advantageously, this is more than three times the concentration of the region 52.

Figure 7:
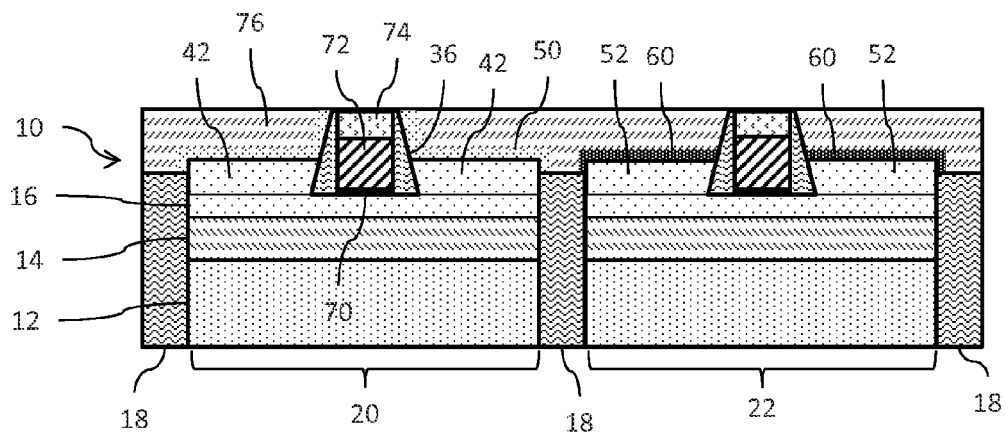

Reference is now made to FIG. 7. The gate structure 32 (and any cap present) has been removed from between the sidewall spacers 34 and replaced with a gate oxide 70, a metal gate electrode 72 and a self-aligned cap 74.

In an embodiment, the gate oxide 70 may comprise a silicon oxide (SiO or SiO$_2$) material or may instead comprise a high-K dielectric material such as hafnium oxide (HfO$_2$). The oxide 70 may have a thickness of 10-20 Å. An atomic layer deposition process may be used to deposit the oxide 70.

In an embodiment, the metal gate electrode 72 is formed any suitable metal material, such as tungsten, used in connection with the gate-last fabrication techniques known to those skilled in the art for the formation of metal gate electrodes. The metal material may be deposited using a chemical vapor deposition process. In an embodiment, the metal gate electrode 72 may include a work function metal (WFM) layer formed, for example, of TiN or titanium carbide (TiC).

In an embodiment, the gate cap 74 may be made of a silicon nitride (SiN) or a siliconborocarbonitride (SiBCN) material. The gate cap 74 may have a thickness of 20-50 nm. A high density plasma (HDP) assisted deposition process may be used to deposit the gate cap material.

Additionally, a dielectric layer 76 is provided to cover the substrate, the raised source-drain structures, the gate stack structures, etc. The dielectric layer 76 may comprise, for example, a silicon oxide (SiO or SiO$_2$) material. The dielectric layer 76 is deposited using a chemical vapor deposition process. Because the deposit is conformal, a process to remove excess material and planarize the top surface of the layer 76 (co-planar with the top of the gate stack and cap 74) is performed. This process may comprise, for example, a chemical-mechanical polishing (CMP) operation.

Figure 8:
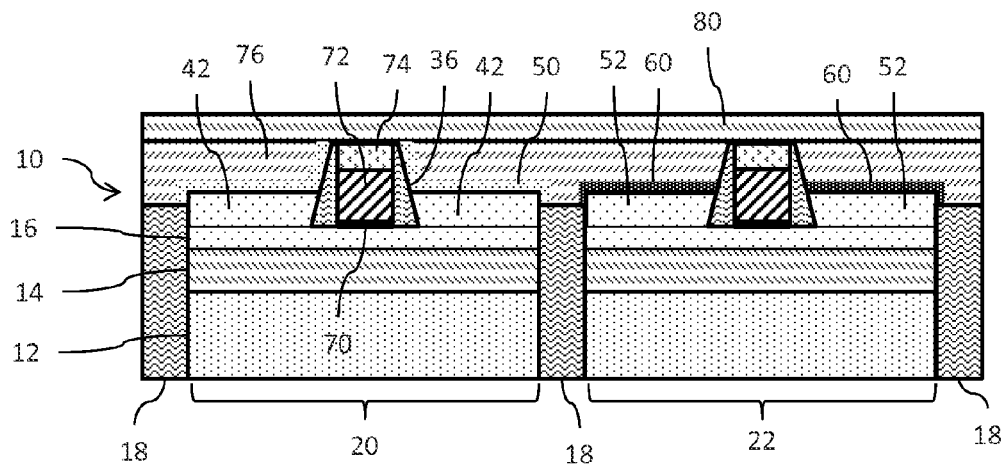

With reference to FIG. 8, an additional dielectric layer 80 is provided on top of the planarized top surface of the dielectric layer 76. This layer 80 is deposited following the completion of the formation of the replacement gate stack with oxide 70, metal gate 72 and cap 74. The dielectric layer 80 may comprise, for example, a silicon oxide (SiO or SiO$_2$) material. The dielectric layer 80 is deposited using a physical vapor deposition (PVD) or chemical vapor deposition process. If necessary, the top surface of layer 80 may also be planarized using, for example, CMP.

The layers 76 and 80 comprise the pre-metal dielectric (PMD) layer for the integrated circuit.

Figure 9:
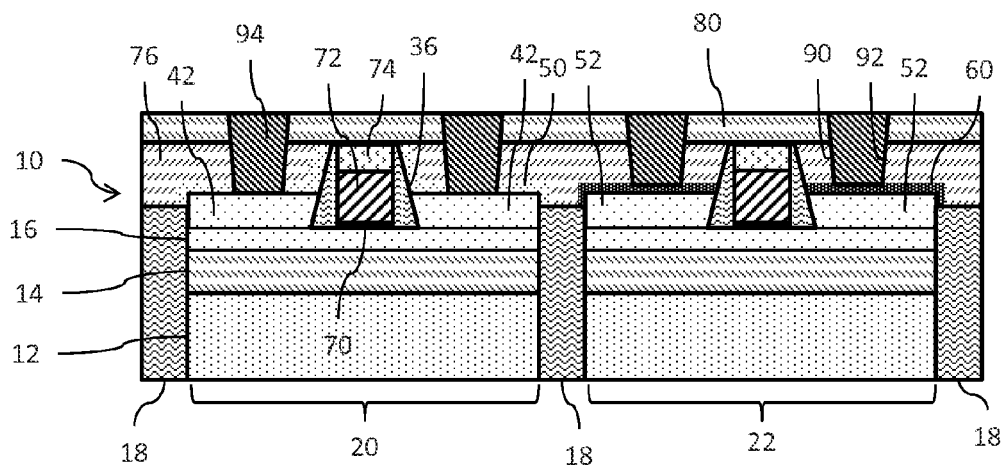

Reference is now made to FIG. 9. Openings 90 are formed over the raised source-drain regions and extending through the PMD layer to expose a top surface of regions 42 and a top surface of the delta-doped silicon germanium (SiGe) layer 60 (over the regions 52). The openings may, for example, be formed using a mask and an anisotropic dry etch process.

A conformal barrier metal layer 92 is then deposited on the sidewalls of each opening 90 and on the top surface of the regions 42 in active region 20 and the top surface of the delta-doped silicon germanium (SiGe) layer 60 in active region 22. The barrier layer 92 may comprise, for example, a titanium nitride (TiN) material. The barrier layer 92 is deposited using a chemical vapor deposition process.

A deposition process is then used to form a deposit 94 of an overlying metal layer, for example, made of tungsten. A chemical vapor deposition (CVD) process is, for example, used to form the tungsten deposit 94. The deposit 94 substantially completely fills each of the openings 90. The deposit 94 may, for example, comprises a conformal deposit including a portion which covers the top surface of the PMD layer. In such a case, a process to remove the excess tungsten material and planarize the top surface of the deposit 94 (co-planar with the top surface of the PMD layer) is performed. This process may comprise, for example, a chemical-mechanical polishing (CMP) operation.

Figure 10:
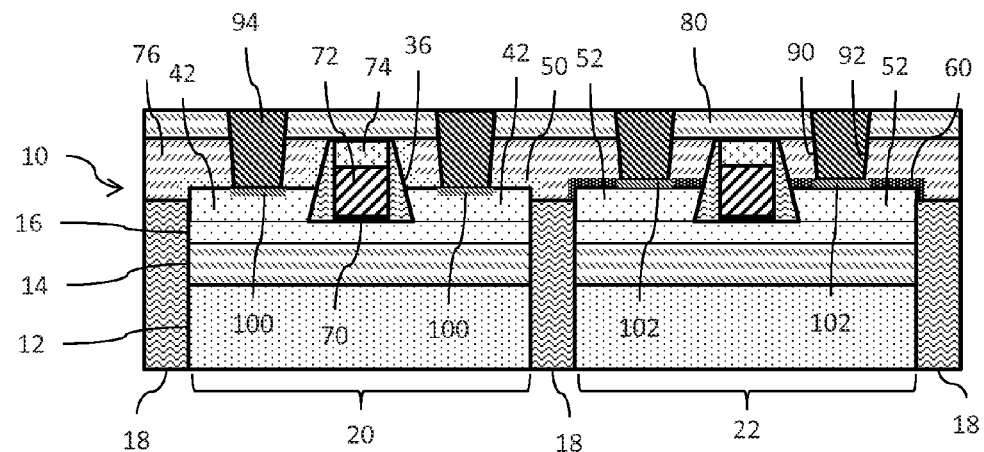

A salicidation process is then performed to form a first low resistance film 100 between the tungsten deposit 94 and the regions 42 in the active region 20 and a second low resistance film 102 between the tungsten deposit 94 and the regions 52 in the active region 22. Heating of the substrate to a suitable temperature, as known to those skilled in the art, causes the TiN layer 92 to react with the silicon material of regions 42 to form a first silicide for the first low resistance film 100 and causes the TiN layer 92 to react with the delta-doped silicon germanium (SiGe) layer 60 to form a second silicide for the second low resistance film 102. The result is shown in FIG. 10.

Completion of the integrated circuit involves the performance of back-end-of-line (BEOL) processing techniques well known to those skilled in the art.

Reference is now made to FIGS. 11-18 showing process steps for fabricating an integrated circuit.

Figure 11:
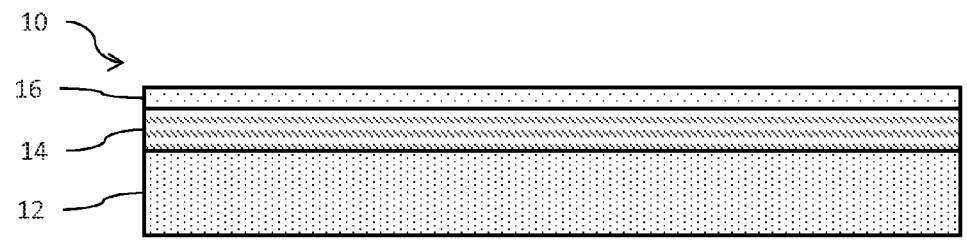
FIGS. 11-18 show process steps in accordance with an embodiment.

FIG. 11 shows an integrated circuit substrate 10. The substrate 10 comprises a silicon-on-insulator (SOI) substrate, as known in the art, including an underlying lightly doped substrate layer 12, an intermediate buried oxide layer 14 and an overlying semiconductor layer 16. More particularly, the overlying semiconductor layer may be fully depleted (i.e., intrinsic semiconductor), and thus the substrate 10 is a fully depleted SOI substrate (FD-SOI). The semiconductor layer 16 may, for example, comprise silicon or silicon-germanium. The underlying lightly doped substrate layer 12 may be made of silicon and have a thickness of 100-800 µm. The intermediate buried oxide layer 14 may have a thickness of 20-200 nm. The overlying semiconductor layer 16 may have a thickness of 20-50 nm.

Figure 12:
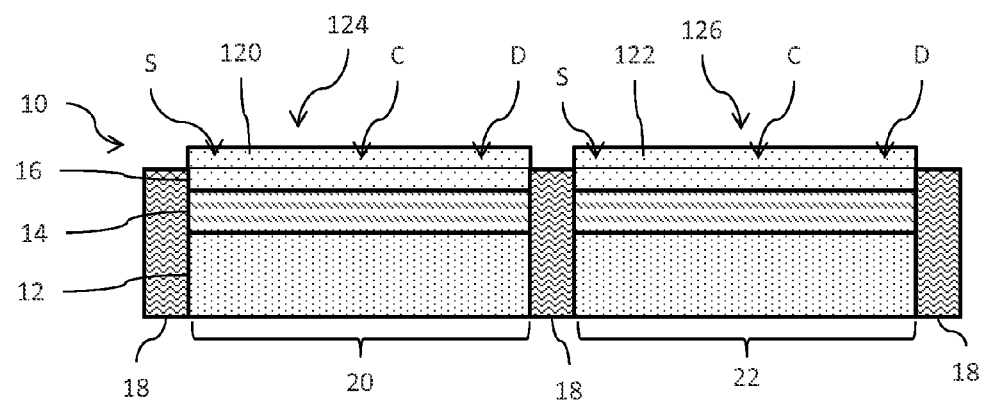

With reference now to FIG. 12, the substrate 10 has been divided by shallow trench isolation (STI) structures 18 (for example, formed by trenches filled with a silicon oxide (SiO or SiO$_2$) material) into a first active region 20 for supporting at least one nMOS FINFET transistor device and a second active region 22 for supporting at least one pMOS FINFET transistor device. Although the STI structures 18 are shown penetrating fully through the substrate 10, it will be understood that the structures 18 could alternatively partially penetrate the substrate 10 and terminate within the underlying lightly doped substrate layer 12.

Using an epitaxial growth process as known in the art, a semiconductor region 120 is grown from the upper surface of the overlying semiconductor layer 16 in the first region 20. The semiconductor region 120 is, for example, formed of silicon (Si) or silicon carbide (SiC). The region 120 may be suitably doped in accordance with the application, for example, with phosphorus (P) or arsenic (As). The doping may be accomplished in situ with the epitaxial growth or through an implantation.

Furthermore, using an epitaxial growth process as known in the art, a semiconductor region 122 is grown from the upper surface of the overlying semiconductor layer 16 in the second region 22. The semiconductor region 122 is, for example, formed of silicon germanium (SiGe). The region 122 may be suitably doped in accordance with the application, for example, with boron (B). The doping may be accomplished in situ with the epitaxial growth or through an implantation. In an embodiment, in-situ boron doped epitaxially-grown region 122 may have a boron concentration of $4 \times 10^{20}$ cm$^{-2}$ to $6 \times 10^{20}$ cm$^{-2}$.

Figure 27:
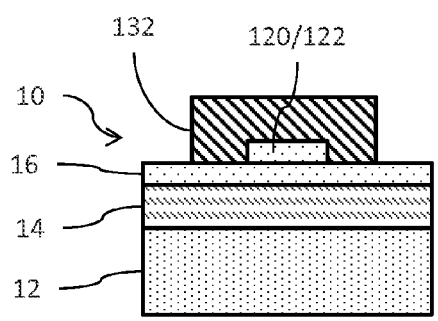
FIGS. 27-28 are cross-sections illustrating fin configuration.

The regions 120 and 122 are patterned, for example, using a lithographic process as known in the art, in the shape of a first fin member 124 over the first region 20 and a second fin member 126 over the second region 22 (see, FIG. 27). In this configuration, each fin member includes a source region S, channel region C and drain region D.

Figure 13:
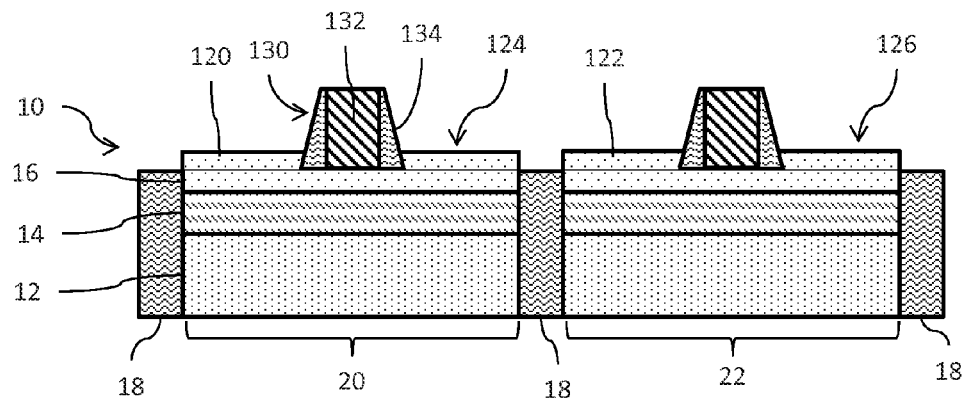

Reference is now made to FIG. 13. A dummy gate stack 130 is formed on top of the upper surface of the overlying semiconductor layer 16 in each region. The gate stack 130 includes a dummy gate structure 132 (see, FIG. 27) and sidewall spacers 134. Each dummy gate stack 130 straddles over its corresponding fin member 124, 126 in the area of the channel region C. The process for formation of the gate stack 130 is well known to those skilled in the art.

In an embodiment, the dummy gate structure 132 is formed of a polysilicon material. The polysilicon material may be doped as needed for the given application. A chemical vapor deposition process may be used to deposit the polysilicon material in a layer. A suitable lithographic process as known in the art is then used to pattern the polysilicon material layer and form the dummy gate structures 132.

In an embodiment, the sidewall spacers 134 may be formed of one or more layers including, without limitation, oxide layers and nitride layers. The illustrated shape of the sidewall spacers 134 does not necessarily represent the actual shape of the spacers. The specific shape is not as important as making sure that the lateral surfaces of the gate structure 132 covered. An atomic layer deposition process may be used to deposit the material for the sidewall spacers 134, with an etch performed to remove the material from the horizontal surfaces so as to leave material on the sidewalls of the gate structure 132.

Although not explicitly shown, an insulating cap may be provided over the gate structure 132 for each gate stack 130.

Figure 14:
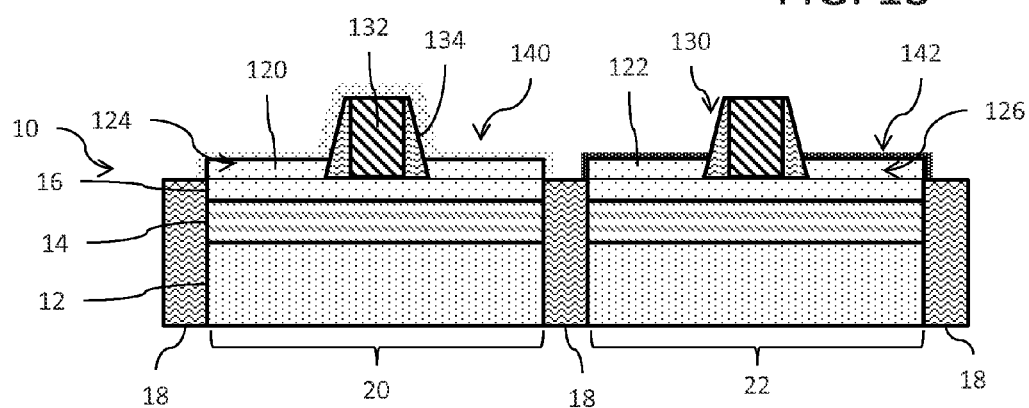

Reference is now made to FIG. 14. A masking material layer 140 is provided over the first region 20. This masking material layer 140 covers the gate stack 130, first fin member 124 (made from layer 120) and the overlying semiconductor layer 16 in the first region 20. The masking material layer 140 may comprise, for example, a silicon nitride (SiN) or a siliconborocarbonitride (SiBCN) material layer having a thickness of 2-5 nm. An atomic layer deposition process may be used to deposit the layer 140.

Using an atomic layer deposition (ALD) technique well known to those skilled in the art, a layer 142 of high boron (B) concentration delta-doped silicon germanium (SiGe) is deposited on the surfaces of the region 122 for the second fin member 126. In an embodiment, the layer 142 may have a boron concentration of $2 \times 10^{22}$ cm$^{-2}$. Advantageously, this is more than three times the concentration of the region 122.

Figure 15:
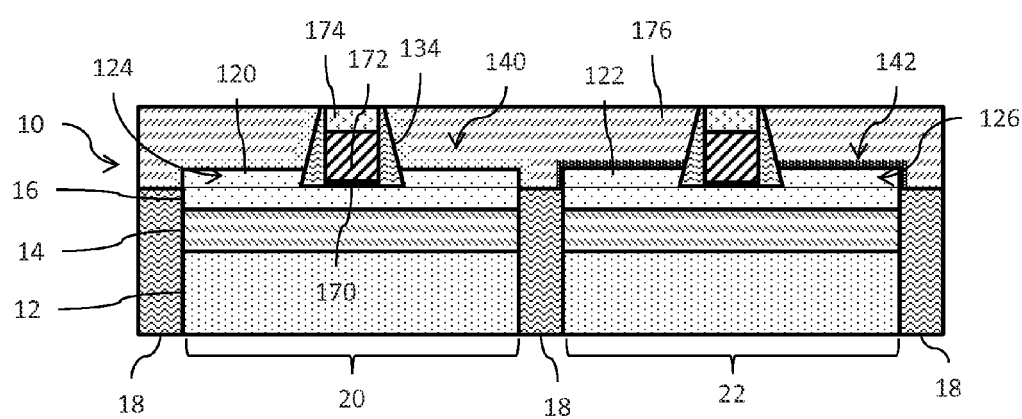

Reference is now made to FIG. 15. The gate structure 132 (and any cap if present) has been removed from between the sidewall spacers 134 and replaced with a gate oxide 170, a metal gate electrode 172 and a self-aligned cap 174.

In an embodiment, the gate oxide 170 may comprise a silicon oxide (SiO or SiO$_2$) material or may instead comprise a high-K dielectric material such as hafnium oxide (HfO$_2$).

The oxide 170 may have a thickness of 10-20 Å. An atomic layer deposition process may be used to deposit the oxide 170.

In an embodiment, the metal gate electrode 172 is formed any suitable metal material, such as tungsten, used in connection with the gate-last fabrication techniques known to those skilled in the art for the formation of metal gate electrodes. The metal material may be deposited using a chemical vapor deposition process. In an embodiment, the metal gate electrode 172 may include a work function metal (WFM) layer formed, for example, of TiN or titanium carbide (TiC).

In an embodiment, the gate cap 174 may be made of a silicon nitride (SiN) or a siliconborocarbonitride (SiBCN) material. The gate cap 174 may have a thickness of 20-50 nm. A high density plasma assisted deposition process may be used to deposit the gate cap material.

Additionally, a dielectric layer 176 is provided to cover the substrate, the raised source-drain structures, the gate stack structures, etc. The dielectric layer 176 may comprise, for example, a silicon oxide (SiO or $SiO_2$) material. The dielectric layer 176 is deposited using a chemical vapor deposition process. Because the deposit is conformal, a process to remove excess material and planarize the top surface of the layer 176 (co-planar with the top of the gate stack and cap 174) is performed. This process may comprise, for example, a chemical-mechanical polishing (CMP) operation.

Figure 16:
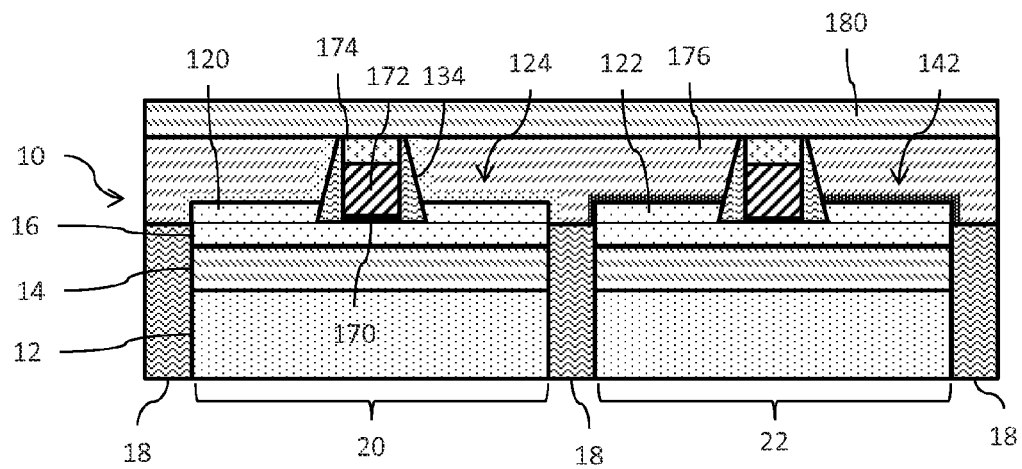

With reference to FIG. 16, an additional dielectric layer 180 is provided on top of the planarized top surface of the dielectric layer 176. This layer 180 is deposited following the completion of the formation of the replacement gate stack with oxide 170, metal gate 172 and cap 174. The dielectric layer 180 may comprise, for example, a silicon oxide (SiO or $SiO_2$) material. The dielectric layer 180 is deposited using a physical vapor deposition or chemical vapor deposition process. If necessary, the top surface of layer 180 may also be planarized using, for example, CMP.

The layers 176 and 180 comprise the pre-metal dielectric (PMD) layer for the integrated circuit.

Figure 17:
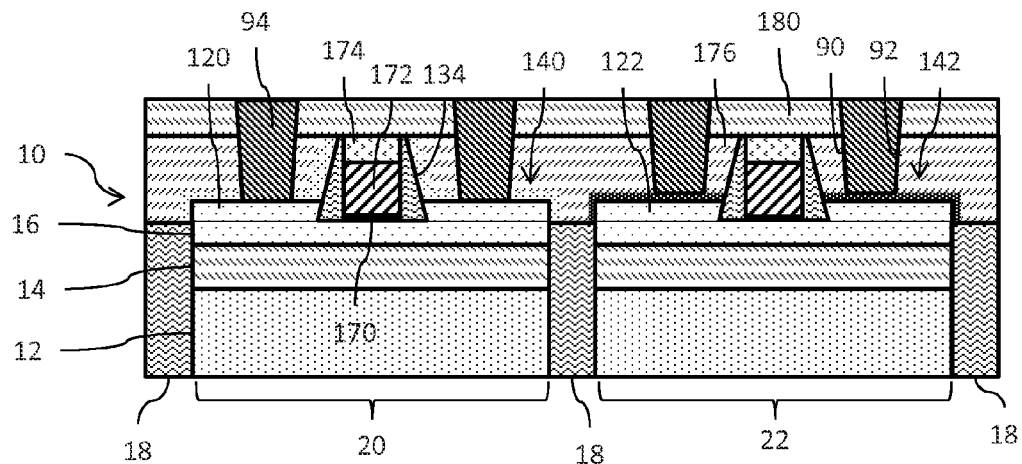

Reference is now made to FIG. 17. Openings 90 are formed over the raised source-drain regions and extending through the PMD layer to expose a top surface of fin 124 and a top surface of the delta-doped silicon germanium (SiGe) layer 142 (over the fin 126). The openings may, for example, be formed using a mask and an anisotropic dry etch process.

A conformal barrier metal layer 92 is then deposited on the sidewalls of each opening 90 and on the top surface of the regions 42 in active region 20 and the top surface of the delta-doped silicon germanium (SiGe) layer 142 in active region 22. The barrier layer 92 may comprise, for example, a titanium nitride (TiN) material. The barrier layer 92 is deposited using a chemical vapor deposition process.

A deposition process is then used to form a deposit 94 of an overlying metal layer, for example, made of tungsten. A chemical vapor deposition (CVD) process is, for example, used to form the tungsten deposit 94. The deposit 94 substantially completely fills each of the openings 90. The deposit 94 may, for example, comprises a conformal deposit including a portion which covers the top surface of the PMD layer. In such a case, a process to remove the excess tungsten material and planarize the top surface of the deposit 94 (co-planar with the top surface of the PMD layer) is performed. This process may comprise, for example, a chemical-mechanical polishing (CMP) operation.

Figure 18:
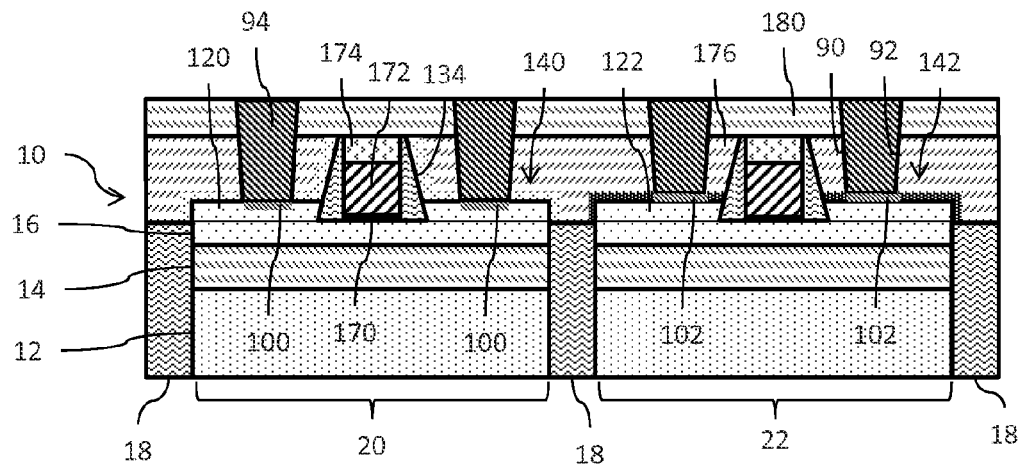

A salicidation process is then performed to form a first low resistance film 100 between the tungsten deposit 94 and the fin 124 in the active region 20 and a second low resistance film 102 between the tungsten deposit 94 and the fin 126 in the active region 22. Heating of the substrate to a suitable temperature, as known to those skilled in the art causes the TiN layer 92 to react with the silicon material of fin 124 to form a first silicide for the first low resistance film 100 and cause the TiN layer 92 to react with the delta-doped silicon germanium (SiGe) layer 142 (on fin 126) to form a second silicide for the second low resistance film 102. The result is shown in FIG. 18.

Completion of the integrated circuit involves the performance of back-end-of-line (BEOL) processing techniques well known to those skilled in the art.

Reference is now made to FIGS. 19-26 showing process steps for fabricating an integrated circuit.

Figure 19:
FIGS. 19-26 show process steps in accordance with an embodiment.

As an alternative to use of an SOI substrate (FIG. 11), a bulk substrate 10' may instead be used as shown in FIG. 19. The bulk substrate 10' comprises a semiconductor material (such as silicon or silicon-germanium) layer 16'. The substrate 10' may be suitably doped as required for the application.

Figure 20:
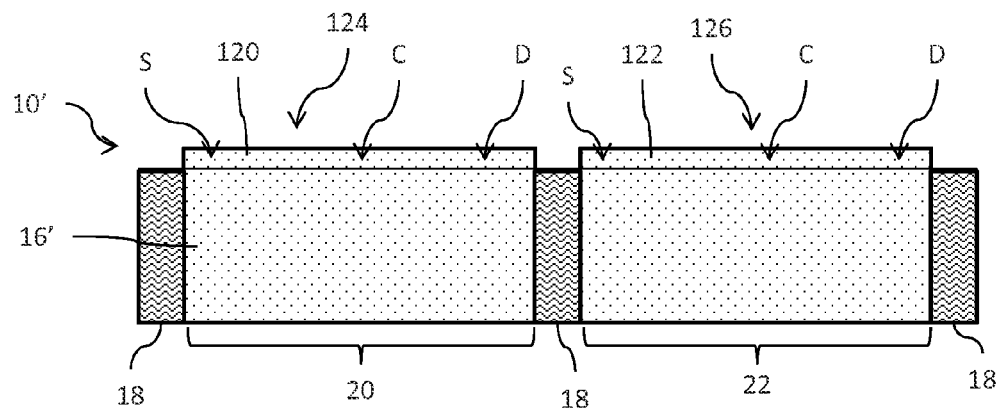

With reference now to FIG. 20, the substrate 10' has been divided by shallow trench isolation (STI) structures 18 (for example, formed by trenches filled with a silicon oxide (SiO or $SiO_2$) material) into a first active region 20 for supporting at least one nMOS FINFET transistor device and a second active region 22 for supporting at least one pMOS FINFET transistor device. Although the STI structures 18 are shown penetrating fully through the substrate 10', it will be understood that the structures 18 could alternatively partially penetrate the substrate 10' and terminate within the layer 16'.

Using an epitaxial growth process as known in the art, a semiconductor region 120 is grown from the upper surface of the overlying semiconductor layer 16 in the first region 20. The semiconductor region 120 is, for example, formed of silicon (Si) or silicon carbide (SiC). The region 120 may be suitably doped in accordance with the application, for example, with phosphorus (P) or arsenic (As). The doping may be accomplished in situ with the epitaxial growth or through an implantation.

Furthermore, using an epitaxial growth process as known in the art, a semiconductor region 122 is grown from the upper surface of the overlying semiconductor layer 16 in the second region 22. The semiconductor region 122 is, for example, formed of silicon germanium (SiGe). The region 122 may be suitably doped in accordance with the application, for example, with boron (B). The doping may be accomplished in situ with the epitaxial growth or through an implantation. In an embodiment, in-situ boron doped epitaxially-grown region 122 may have a boron concentration of $4\times10^{20}$ $cm^{-2}$ to $6\times10^{20}$ $cm^{-2}$.

Figure 28:
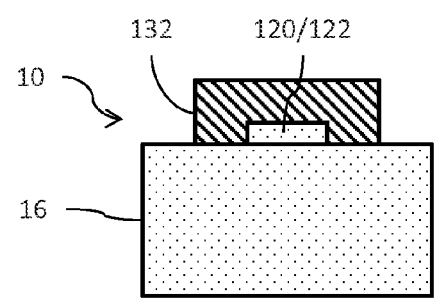

The regions 120 and 122 are then patterned, for example, using a lithographic process as known in the art, in the shape of a first fin member 124 over the first region 20 and a second fin member 126 over the second region 22 (see, FIG. 28). In this configuration, each fin member includes a source region S, channel region C and drain region D.

Figure 21:
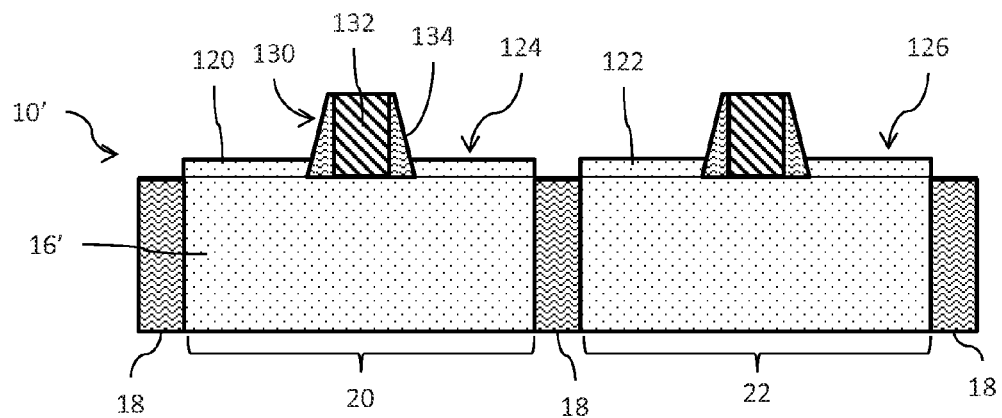

Reference is now made to FIG. 21. A dummy gate stack 130 is formed on top of the upper surface of the overlying semiconductor layer 16 in each region. The gate stack 130 includes a dummy gate structure 132 (see, FIG. 28) and sidewall spacers 134. Each dummy gate stack 130 straddles over its corresponding fin member 124, 126 in the area of the channel region C. The process for formation of the gate stack 130 is well known to those skilled in the art.

In an embodiment, the dummy gate structure 132 is formed of a polysilicon material. The polysilicon material may be doped as needed for the given application. A chemical vapor deposition process may be used to deposit the polysilicon material in a layer. A suitable lithographic process as known in the art is then used to pattern the polysilicon material layer and form the dummy gate structures 132.

In an embodiment, the sidewall spacers 134 may be formed of one or more layers including, without limitation, oxide layers and nitride layers. The illustrated shape of the sidewall spacers 134 does not necessarily represent the actual shape of the spacers. The specific shape is not as important as making sure that the lateral surfaces of the gate structure 132 covered. An atomic layer deposition process may be used to deposit the material for the sidewall spacers 134, with an etch performed to remove the material from the horizontal surfaces so as to leave material on the sidewalls of the gate structure 132.

Figure 22:
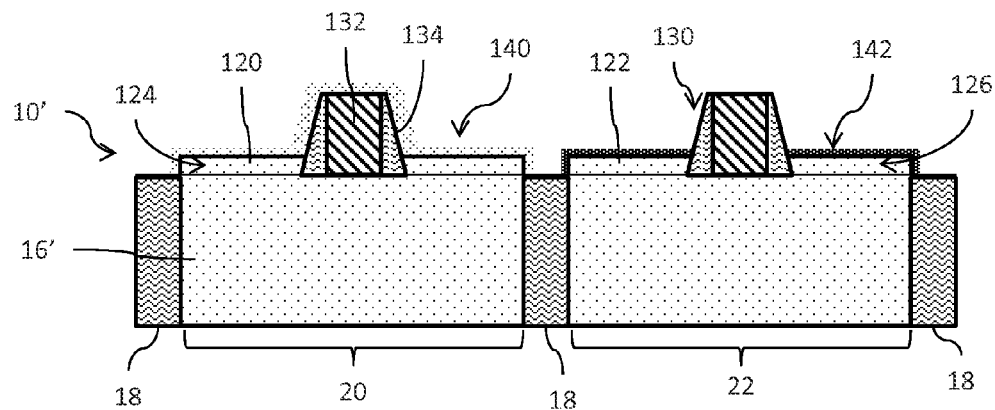

Reference is now made to FIG. 22. A masking material layer 140 is provided over the first region 20. This masking material layer 140 covers the gate stack 130, first fin member 124 and overlying semiconductor layer 16 in the first region 20. The masking material layer 140 may comprise, for example, a silicon nitride (SiN) or a siliconborocarbonitride (SiBCN) material layer having a thickness of 2-5 nm. An atomic layer deposition process may be used to deposit the layer 140.

Using an atomic layer deposition (ALD) technique well known to those skilled in the art, a layer 142 of high boron (B) concentration delta-doped silicon germanium (SiGe) is deposited on the surfaces of the region 122 for the second fin member 126. In an embodiment, the layer 142 may have a boron concentration of $2 \times 10^{22}$ cm$^{-2}$. Advantageously, this is more than three times the concentration of the region 122.

Figure 23:
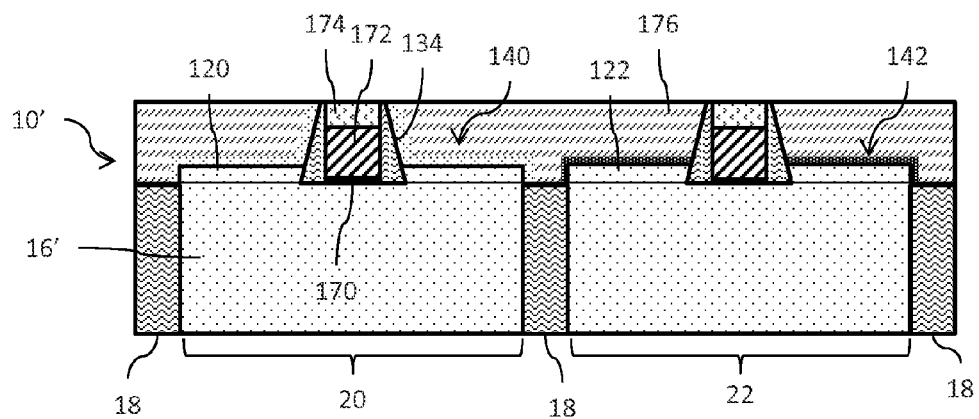

Reference is now made to FIG. 23. The gate structure 132 has been removed from between the sidewall spacers 134 and replaced with a gate oxide 170, a metal gate electrode 172 and a self-aligned cap 174.

In an embodiment, the gate oxide 170 may comprise a silicon oxide (SiO or SiO$_2$) material or may instead comprise a high-K dielectric material such as halfnium oxide (HfO$_2$). The oxide 170 may have a thickness of 10-20 Å. An atomic layer deposition process may be used to deposit the oxide 170.

In an embodiment, the metal gate electrode 172 is formed any suitable metal material, such as tungsten, used in connection with the gate-last fabrication techniques known to those skilled in the art for the formation of metal gate electrodes. The metal material may be deposited using a chemical vapor deposition process. In an embodiment, the metal gate electrode 172 may include a work function metal (WFM) layer formed, for example, of TiN or titanium carbide (TiC).

In an embodiment, the gate cap 174 may be made of a silicon nitride (SiN) or a siliconborocarbonitride (SiBCN) material. The gate cap 174 may have a thickness of 20-50 nm. A high density plasma assisted deposition process may be used to deposit the gate cap material.

Additionally, a dielectric layer 176 is provided to cover the substrate, the raised source-drain structures, the gate stack structures, etc. The dielectric layer 176 may comprise, for example, a silicon oxide (SiO or SiO$_2$) material. The dielectric layer 176 is deposited using a chemical vapor deposition process. Because the deposit is conformal, a process to remove excess material and planarize the top surface of the layer 176 (co-planar with the top of the gate stack and cap 174) is performed. This process may comprise, for example, a chemical-mechanical polishing (CMP) operation.

Figure 24:
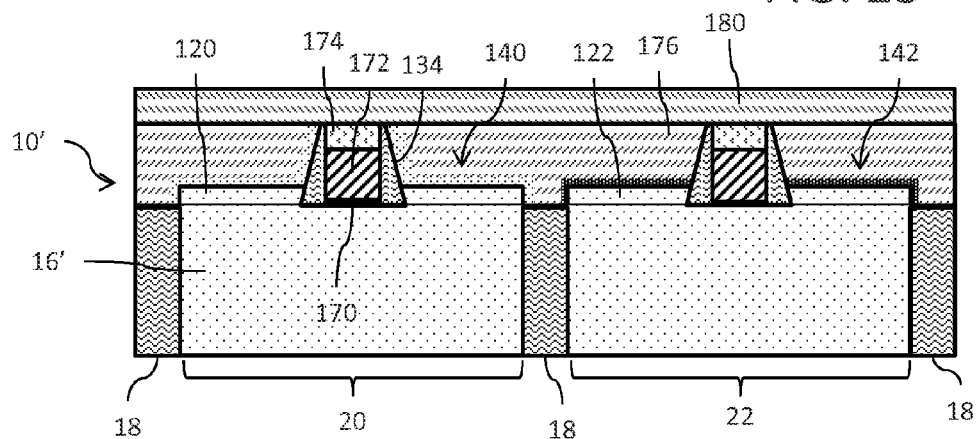

With reference to FIG. 24, an additional dielectric layer 180 is provided on top of the planarized top surface of the dielectric layer 176. This layer 180 is deposited following the completion of the formation of the replacement gate stack with oxide 170, metal gate 172 and cap 174. The dielectric layer 180 may comprise, for example, a silicon oxide (SiO or SiO$_2$) material. The dielectric layer 180 is deposited using a physical vapor deposition or chemical vapor deposition process. If necessary, the top surface of layer 180 may also be planarized using, for example, CMP.

The layers 176 and 180 comprise the pre-metal dielectric (PMD) layer for the integrated circuit.

Figure 25:
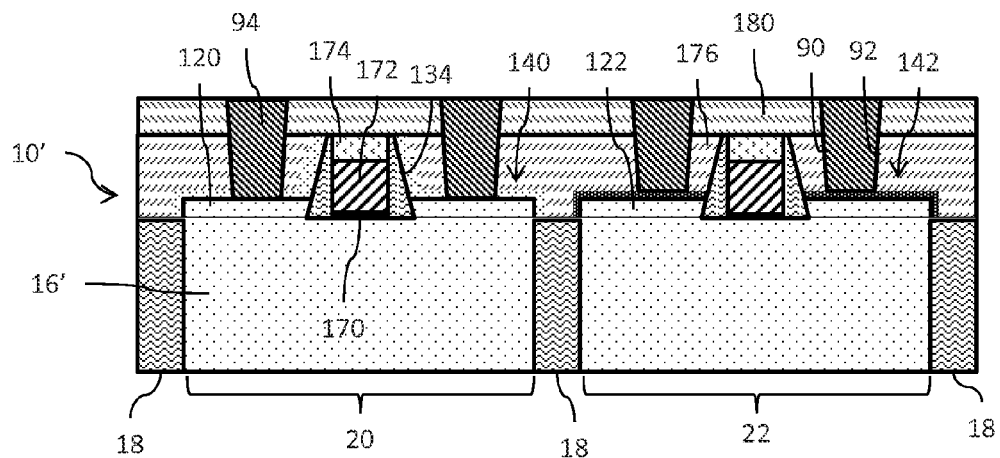

Reference is now made to FIG. 25. Openings 90 are formed over the raised source-drain regions and extending through the PMD layer to expose a top surface of fin 124 and a top surface of the delta-doped silicon germanium (SiGe) layer 142 (over the fin 126). The openings may, for example, be formed using a mask and an anisotropic dry etch process.

A conformal barrier metal layer 92 is then deposited on the sidewalls of each opening 90 and on the top surface of the regions 42 in active region 20 and the top surface of the delta-doped silicon germanium (SiGe) layer 142 in active region 22. The barrier layer 92 may comprise, for example, a titanium nitride (TiN) material. The barrier layer 92 is deposited using a chemical vapor deposition process.

A deposition process is then used to form a deposit 94 of an overlying metal layer, for example, made of tungsten. A chemical vapor deposition (CVD) process is, for example, used to form the tungsten deposit 94. The deposit 94 substantially completely fills each of the openings 90. The deposit 94 may, for example, comprises a conformal deposit including a portion which covers the top surface of the PMD layer. In such a case, a process to remove the excess tungsten material and planarize the top surface of the deposit 94 (co-planar with the top surface of the PMD layer) is performed. This process may comprise, for example, a chemical-mechanical polishing (CMP) operation.

Figure 26:
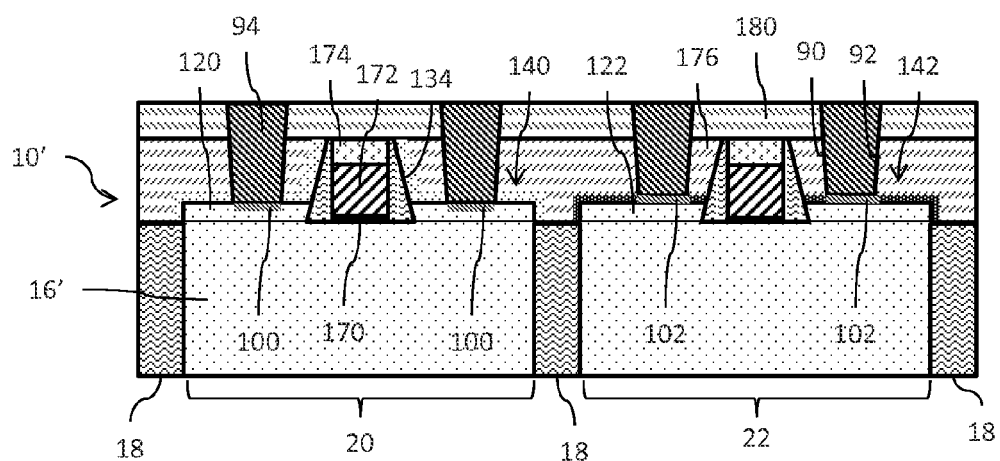

A salicidation process is then performed to form a first low resistance film 100 between the tungsten deposit 94 and the fin 124 in the active region 20 and a second low resistance film 102 between the tungsten deposit 94 and the fin 126 in the active region 22. Heating of the substrate to a suitable temperature, as known to those skilled in the art causes the TiN layer 92 to react with the silicon material of fin 124 to form a first silicide for the first low resistance film 100 and cause TiN layer 92 to react with the delta-doped silicon germanium (SiGe) layer 142 (on fin 126) to form a second silicide for the second low resistance film 102. The result is shown in FIG. 26.

Completion of the integrated circuit involves the performance of back-end-of-line (BEOL) processing techniques well known to those skilled in the art.

Although making and using various embodiments are discussed in detail herein, it should be appreciated that as described herein are provided many inventive concepts that may be embodied in a wide variety of contexts. Embodiments discussed herein are merely representative and do not limit the scope of the invention.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:
1. An integrated circuit, comprising:
   a nMOS transistor having a source region, a drain region and a gate;
   a pMOS transistor having a source region, a drain region and a gate;

a high dopant concentration delta-doped layer on the source region and drain region of the pMOS transistor;

a pre-metal dielectric layer covering the nMOS transistor and the pMOS transistor;

a first set of contacts extending through the pre-metal dielectric layer to the source region and drain region of the nMOS transistor;

a second set of contacts extending through the pre-metal dielectric layer to the source region and drain region of the pMOS transistor;

a first silicide region at a bottom of the first set of contacts formed by a salicidation reaction between a metal and a first semiconductor material forming the source region and drain region of the nMOS transistor; and a second silicide region at a bottom of the second set of contacts formed by a salicidation reaction between a metal and the high dopant concentration delta-doped layer on the source region and drain region of the pMOS transistor.

2. The integrated circuit of claim 1, wherein the first semiconductor material forming the source region and drain region of the nMOS transistor is selected from the group consisting of silicon and silicon carbide, and a second semiconductor material forming the source region and drain region of the pMOS transistor is selected from the group consisting of silicon and silicon-germanium.

3. The integrated circuit of claim 1, wherein the source regions and drain regions of the nMOS and pMOS transistors comprise raised source-drain structures.

4. The integrated circuit of claim 1, wherein the source regions and drain regions of the nMOS and pMOS transistors comprise fin structures.

5. The integrated circuit of claim 1, wherein the nMOS and pMOS transistors are supported by a substrate selected from the group consisting of a silicon-on-insulator (SOI) substrate and a bulk substrate.

6. The integrated circuit of claim 5, wherein an upper semiconductor layer of the SOI substrate is fully depleted.

7. The integrated circuit of claim 1, wherein a second semiconductor material forming the source region and drain region of the pMOS transistor comprises silicon-germanium and wherein the high dopant concentration delta-doped layer comprises silicon-germanium.

8. The integrated circuit of claim 7, wherein a dopant for the high dopant concentration delta-doped layer comprises boron.

9. The integrated circuit of claim 1, wherein the metal of the salicidation reaction comprises titanium, and wherein the first and second silicide regions comprise a titanium silicide.

10. An integrated circuit, comprising:
a substrate;
a transistor having a source region and a drain region supported by said substrate;
a high dopant concentration delta-doped layer on the source region and drain region of the transistor;
a pre-metal dielectric layer covering the transistor;
a set of contacts extending through the pre-metal dielectric layer to the source region and drain region of the transistor;
a silicide region at a bottom of the set of contacts formed by a metal silicide of the high dopant concentration delta-doped layer on the source region and drain region of the transistor.

11. The integrated circuit of claim 10, wherein the substrate is a silicon-on-insulator substrate.

12. The integrated circuit of claim 10, wherein a semiconductor material forming the source region and drain region of the transistor is selected from the group consisting of silicon and silicon-germanium.

13. The integrated circuit of claim 10, wherein the source region and drain region of the transistor comprise raised source-drain structures.

14. The integrated circuit of claim 10, wherein the source region and drain region of the transistor comprise fin structures.

15. The integrated circuit of claim 10, wherein the transistor is a pMOS.

16. The integrated circuit of claim 10, wherein the metal comprises titanium, and wherein the silicide region comprise a titanium silicide.

17. An integrated circuit, comprising:
a substrate;
a transistor having a source region and a drain region supported by said substrate;
a high dopant concentration delta-doped layer on the source region and drain region of the transistor;
a pre-metal dielectric layer covering the transistor;
contacts extending through the pre-metal dielectric layer to the source region and drain region of the transistor;
a conductive region at a bottom of each contact comprising a metal silicide of a first portion of the high dopant concentration delta-doped layer, wherein a second portion of the high dopant concentration delta-doped layer on each side of the first portion is not silicided.

18. The integrated circuit of claim 17, wherein the substrate is a silicon-on-insulator substrate.

19. The integrated circuit of claim 17, wherein a semiconductor material forming the source region and drain region of the transistor is selected from the group consisting of silicon and silicon-germanium.

20. The integrated circuit of claim 17, wherein the source region and drain region of the transistor comprise raised source-drain structures.

21. The integrated circuit of claim 17, wherein the source region and drain region of the transistor comprise fin structures.

22. The integrated circuit of claim 17, wherein the transistor is a pMOS.

23. The integrated circuit of claim 17, wherein the metal of the metal silicide comprises titanium.

24. The integrated circuit of claim 17, wherein the transistor is a nMOS.

* * * * *